United States Patent [19]
Schmidt

[11] 3,946,338
[45] Mar. 23, 1976

[54] ACOUSTIC WAVE DEVICES INVOLVING PERTURBATION OF ACOUSTIC VELOCITY BY DIFFUSION OF METALS

[75] Inventor: Ronald Vernon Schmidt, Matawan, N.J.

[73] Assignee: Bell Telephone Laboratories, Incorporated, Murray Hill, N.J.

[22] Filed: June 9, 1975

[21] Appl. No.: 584,765

[52] U.S. Cl.................. 333/30 R; 310/8.2; 310/9.8
[51] Int. Cl.$^2$.. H03H 9/26; H03H 9/30; H03H 9/32; H01L 41/18
[58] Field of Search........................... 333/30 R, 72; 310/8–9.7; 252/62.9 R; 29/25.35; 350/96 WG

[56] References Cited
UNITED STATES PATENTS

| | | | |
|---|---|---|---|
| 3,845,420 | 10/1974 | Holland et al. | 333/30 R |
| 3,882,429 | 5/1975 | Martin | 333/30 R |

OTHER PUBLICATIONS

Fink–Television Engineering Handbook McGraw–Hill N.Y. 1957, pp. 15–31, 32.
Menlgailis et al. – Bandpass Surface Wave Filters in Proc. 1972 IEEE Ultrasonics Symposium Oct. 1972; pp. 221–225.
Wei et al. – Quartz Optical Waveguide by Ion Implantation in Appl. Phys. Ltrs. Vol. 22, No. 1, Jan 1, 1973; pp. 5–7.
Martin – The Imcon Pulse Compression Filter and its applications in IEEE Trans. on Sonics and Ultrasonics, Vol. 20, Apr. 1973; pp. 104–112.
Wei et al. – Large Refractive Index Change induced by Ion Implantation in Lithium Niobate in Appl. Phys. Ltrs. Vol. 25, No. 6, Sept. 15, 1974; pp. 329–331.
Li et al. – On the Performance and Limitations of the Surface–Wave Resonator using Grooved Reflectors in Proc. 1974 IEEE Ultrasonics, Symp., Milwaukee, Wisconsin, 1974, pp. 257–262.
Smith et al. – Dispersive Rayleigh Wave Delay Line using Gold on Lithium Niobate in IEEE Trans. on Microwave Theory and Techniques, Nov. 1969, pp. 1043–1044.
Marshall et al. – Theory and Design of the Surface Acoustic Wave Multistrip Coupler in IEEE Trans. on Sonics and Ultrasonics, Apr. 1973, pp. 124–133.
Hartemann – Surface–Acoustic–Wave Guidance Produced by Ion Implantation in Quartz in Electronics Letters, Apr. 4, 1974; pp. 110–111.
Schmidt et al. – Metal–Diffused Optical Waveguides in LiNbO$_3$ in Appl. Phys. Ltrs. Vol. 25, No. 8, Oct. 15, 1974; pp. 458–460.
Staples – UHF Surface Acoustic Wave Resonators in Proc. 1974 IEEE Ultrasonics Symposium Cat. No. 74 CHO 896-ISU; pp. 245–252.

*Primary Examiner*—Alfred E. Smith
*Assistant Examiner*—Marvin Nussbaum
*Attorney, Agent, or Firm*—Wilford L. Wisner

[57] ABSTRACT

Acoustic waveguides, acoustic filters and acoustic reflectors are based upon the discovery of increased acoustic wave velocity in materials such as lithium niobate and lithium tantalate into which a metal such as titanium, nickel or chromium has been diffused. Velocity increases larger than 1 percent have been obtained; and negligible effect on acoustic loss is incurred thereby. The technique and the resulting devices result in a simpler structure than provided by the metallic strips or the ion beam etched surface regions of prior acoustic devices in which velocity perturbations of comparable magnitude have been desired.

16 Claims, 6 Drawing Figures

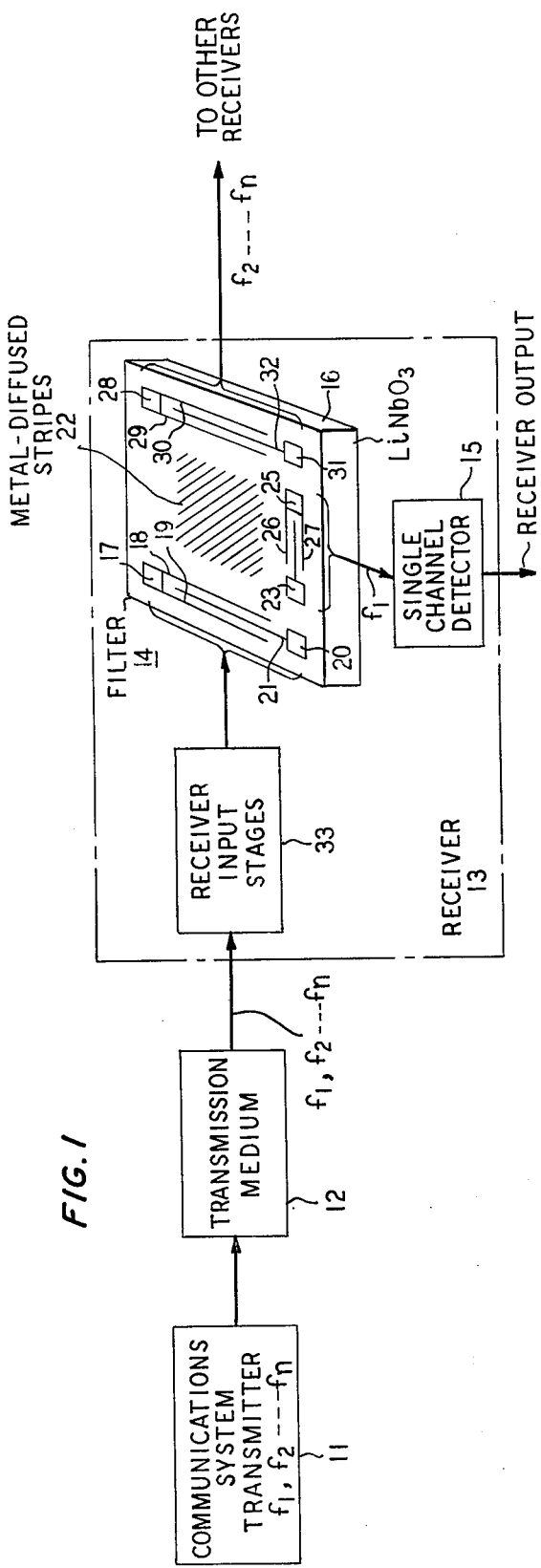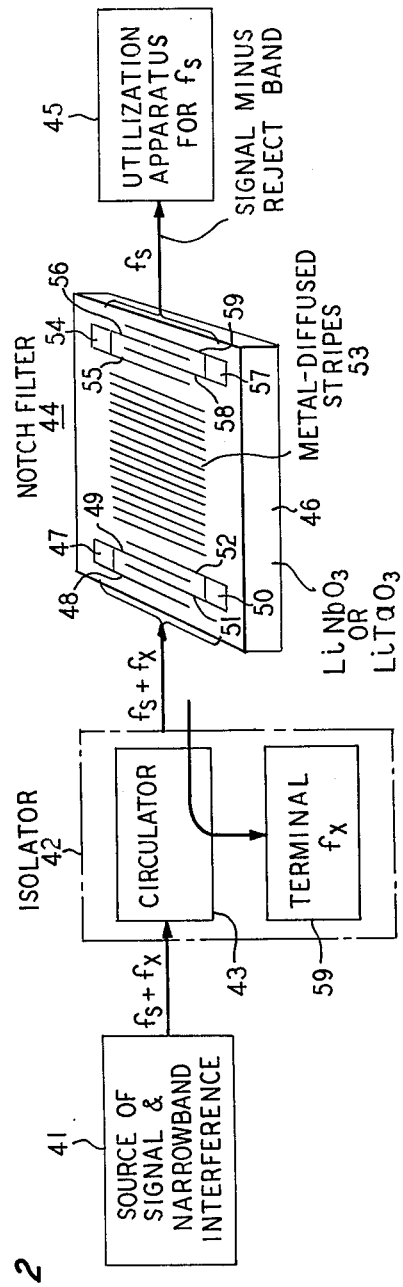

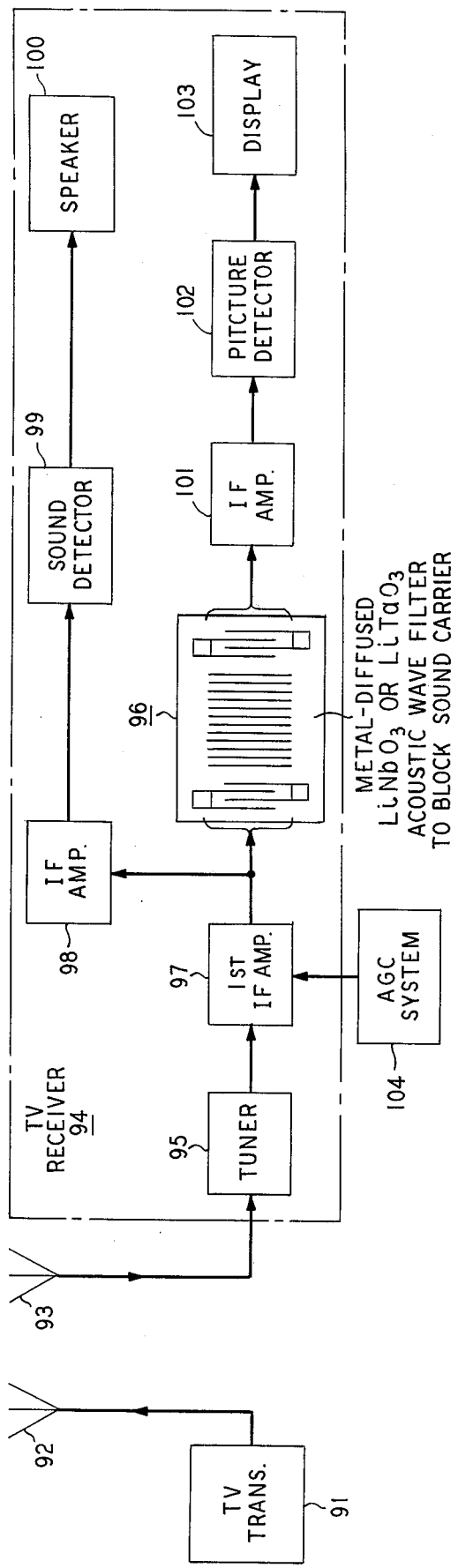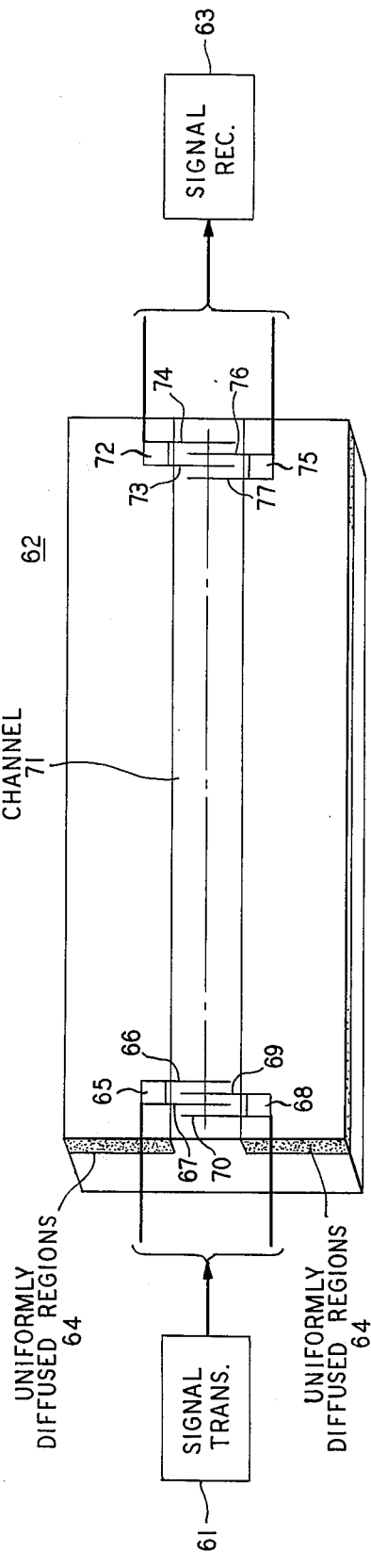

ACOUSTIC WAVE DEVICES INVOLVING PERTURBATION OF ACOUSTIC VELOCITY BY DIFFUSION OF METALS

BACKGROUND OF THE INVENTION

This invention relates to acoustic devices in which two or more regions of differing acoustic wave velocity are desired.

Acoustic wave filters, particularly acoustic surface wave filters, appear to have increasing potential for use in commercial applications such as commercial television circuits. For example, a filter for such an application typically employs a region of a dielectric crystal in which a substantially periodic pattern of perturbations of velocity are imposed, typically by metal strips on the surface of the crystal or by ion beam etching depressions in the surface of the crystal in the desired substantially periodic pattern. A bandwidth broader than that obtainable from a uniform spacing is obtained in the filter by providing a selected, reproducible variation in the spacing of the metal stripes or other surface loading stripes.

In the unrelated optical device art, it has recently been shown that the diffusion of metals or their oxides into lithium tantalate or into lithium niobate changes the optical refractive index of the crystal in the region where the diffusion took place. Such techniques have resulted in a simplification of optical devices which require two or more regions of differing optical index of refraction. Although the same materials, lithium niobate and lithium tantalate, also have elastic properties making them usable in some acoustic devices, initial analysis tended to be discouraging as to the possibility of obtaining analogous device simplification in the acoustic device as in the optical device. Not only was it impossible to predict whether an appreciable effect on acoustic velocity would result from such techniques; but it was also impossible to predict even the sense of the effect. Perhaps most importantly, it was thought that most metals that could be introduced into the bulk of lithium niobate or lithium tantalate might have a decidedly adverse effect on the overall loss of acoustic devices, as compared to devices which use only the prior art surface loading techniques.

SUMMARY OF THE INVENTION

My invention is based on my discovery that the diffusion of metals, such as titanium, nickel and chromium into lithium niobate increases the acoustic velocity in the diffused region by a significant amount, up to a value of change that is substantially more than 1 percent, without any readily apparent increase in acoustic loss.

One feature of my invention is directed to the application of this discovery to provide regions of uniformly increased acoustic wave velocity about an undiffused channel, thereby producing an acoustic waveguide. Subsidiary features are directed both to fiber and planar forms of this feature.

Another feature of my invention is directed to the employment of a periodic, or substantially periodic, pattern of regions of increased acoustic wave velocity to produce an acoustic filter of selected bandwidth and selected passband or stopband shape. The resulting acoustic wave filters are not only simpler and less expensive to produce than the prior commercially employed acoustic surface wave devices, but are also more versatile with respect to the achievement of desired characteristics. In addition, improved performance can be expected in applications such as channel dropping filters for communications, notch filters, and intermediate frequency filters for television circuits Acoustic resonator-filters can also be implemented with pairs of grating-reflectors according to my invention.

BRIEF DESCRIPTION OF THE DRAWING

Further features and advantages of my invention will become apparent from the following detailed description, taken together with the drawing, in which:

FIG. 1 is a partially pictorial and partially block diagrammatic illustration of an illustrative channel dropping filter employing the invention;

FIG. 2 is a partially pictorial and partially block diagrammatic illustration of a notch filter embodiment of the invention likewise employed in a communication system;

FIG. 3 is a partially pictorial and partially block diagrammatic illustration of another embodiment of the invention employed as an intermediate frequency filter in a television system;

FIG. 4 is a partially pictorial and partially block diagrammatic illustration of a substantially planar acoustic waveguide embodiment of my invention;

DESCRIPTION OF ILLUSTRATIVE EMBODIMENTS

Figure 5:
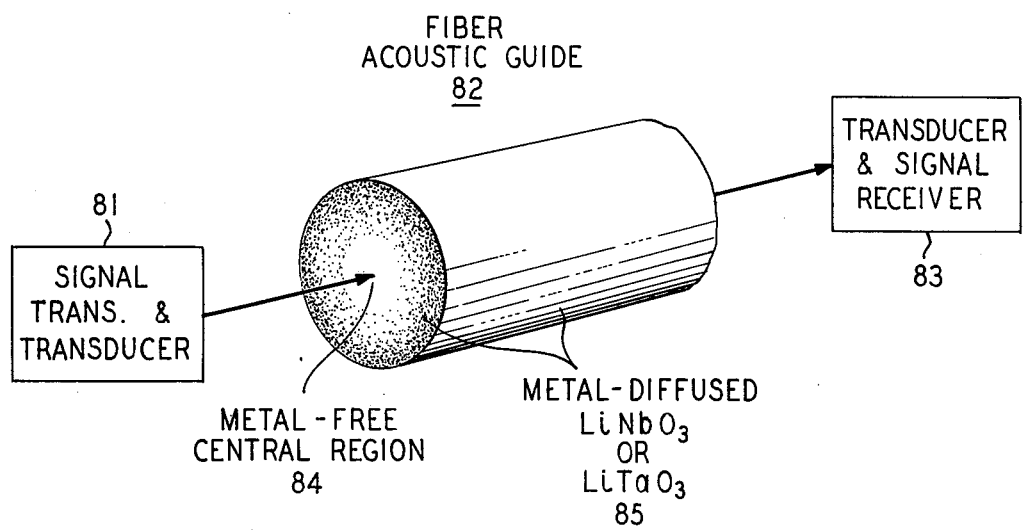
FIG. 5 shows a modification of the embodiment of FIG. 4 for a fiber acoustic waveguide configuration.

In the embodiment of FIG. 1 it is desired to employ an acoustic wave filter to separate one channel from a plurality of frequency-multiplexed channels in a communication system. Regardless of the type of transmitter 11 in such a system or the type of the transmission medium 12 in such a system, it has occasionally been found desirable in the past to employ an acoustic wave filter for channel-dropping purposes in a typical receiver 13.

In the embodiment of FIG. 1 the filter 14, according to my invention, replaces a prior art channel dropping filter, the frequency characteristics of which were determined by grating reflections induced by periodic loading by conducting metal strips on the surface of the acoustic material or by mass loading dielectric strips on the surface, or ridges or grooves that were etched into the surface by ion beam etching.

The filter 14 comprises the dielectric crystal 16 of Y-cut, Z-propagating lithium niobate disposed between the input from transmission medium 12 to receiver 13 and the single channel detector 15 of receiver 13. The filter 14 also included electroacoustic transducers 17, 18, 19 and 20, 21, used as input transducers and the similar transducers 28, 29, 30 and 31, 32 used as output transducers. Between the input and output transducers, the crystal 16 includes a periodic pattern 22 of stripe-like or grating like regions produced by diffusing metal from the surface of the crystal 16 into its bulk by an appreciable distance, typically less than an acoustic wavelength.

To create each stripe in the stripe pattern 22, in which an acoustic wave experiences substantially increased acoustic velocity, a metal, illustratively titanium (Ti), is diffused. Illustratively to achieve this diffusion a photolithographic technique is employed. Specifically, by such techniques thin stripes of metal of thickness $\tau$ is first deposited onto the crystal surface. The crystal is then placed in an inert atmosphere, typically argon and heated at temperature selected T for a selected time t. After time t, the atosphere is changed to to flowing oxygen to replace any oxygen which the crystal has lost during diffusion and the crystal is allowed to cool. The metal diffuses to an effective depth given by $$b = (4Dt)^{1/2}, \qquad (1)$$

where D is the diffusion constant. The exact diffusion profile depends strongly on the diffusion parameters $\tau$, $t$, T. Typical for the work described here, $\tau = 1000\text{A}$, $t = 30$ hours and $T = 1000°C$. The regions diffused with Ni and Cr were pale yellow and pale green, respectively, while the Ti diffused regions were clear. These optical properties doe not appear to have any substantial relationship to acoustic properties of the materials so diffused.

In order to determine the acoustic velocity change induced by metal diffusion, the acoustic surface wave velocity in a metal diffused region was measured relative to the unperturbed acoustic surface wave velocity on the same crystal. These measurements were made by evaporating metal patterns of Ni, Cr and Ti of known length on the surface of Y-cut-Z propagating LiNbO$_3$ crystals. The metal films were diffused into the crystal under the conditions described in Table I.

distributions to actual profiles measured by electroprobe analysis. The diffusion depth of Cr was not measured; but Cr does not readily diffuse into LiNbO$_3$ and bi is thought to be $\sim 1$, $\mu$m.

From examination of Table I it can be observed that the Ti and Cr diffused regions are dispersive and produce a surface wave velocity increase of about 1 percent at 412 MHz, where the acoustic wavelength is 8.8 $\mu$m. The Ni diffused region shows little dispersion and a velocity increase of $\sim 0.5$ percent. This is expected since the diffusion depth is much greater than the acoustic wavelength of both frequencies. From the data supplied in Table I one can crudely estimate that for a uniform 5 percent concentration of diffusant atoms to Nb atoms the acoustic surface wave velocity perturbation, $\Delta v/v$, would be 3 percent and 5 percent for Ti and Ni respectively. A more accurate calculation of these numbers would require detailed knowledge of the diffusion profiles and should take into consideration the complex nature of the acoustic strains.

There was no readily apparent increased loss in the diffused regions compared to the undiffused regions for a 1 cm propagation length at frequencies as high as 412 MHz. Any differences between insertion loss for waves traveling through the diffused and undiffused regions, which were on the order of 0.1 dB, could be accounted for by slight differences in the output transducers' efficiency. At 412 MHz, LiNbO$_3$ propagation loss is $\sim 0.4$ dB/cm and the air loading loss is $\sim 0.2$ dB/m.

In the operation of the embodiment of FIG. 1 the

TABLE I

| METAL | $\tau$ (A) | T (°C) | b ($\mu$m) | $N_{Dif}/N_{Nb}$ | $\Delta v_p/v$ 80 MHz | $\Delta v_g/v$ 80 MHz | $\Delta v_p/v$ 412 MHz | $\Delta v_g/v$ 412 MHz |
|---|---|---|---|---|---|---|---|---|
| Ti | 1000 | 1000 | 3 | .050 | .0030 | .0015 | .0115 | .0129 |
| Ti | 1500 | 1000 | 3 | .075 | .0029 | .002 | .0138 | .0144 |
| Ni | 1000 | 1000 | 100 | .0048 | .0043 | .0047 | .0047 | .0047 |
| Cr | 500 | 1075 | — | — | .0039 | .0047 | .0075 | .0085 |
| Cr | 800 | 1075 | — | — | .0045 | .0059 | .0104 | .0110 |

Several of the parameters in the table have been defined above. The remainder are the phase velocity change, $\Delta v_p$, the group velocity change, $\Delta v_g$, the proportion of diffused metal atoms to niobium atoms in the host crystal, $N_{Dif}/N_{Nb}$, and the frequencies at which the velocity changes were measured. Three identical, equally spaced transducers of 44 microns periodicity were then fabricated on each crystal such that the metal diffused region was contained completely between two of the transducers. By driving the center transducer and measuring the phase difference between the two output transducers both the phase velocity, $v_p$ and group velocity, $v_g$ of the diffused region was obtained relative to the undiffused region. This technique is the same as that previously described in more detail. See the article by L. A. Coldren and R. V. Schmidt, *Applied Physics Letters*, Volume 23, page 482 (1973). These measurements were taken at the transducer's fundamental frequency, 81 MHz, and its fifth harmonic, 412 MHz. The results are given in Table I. The Ti diffusion effective depth, $b=3\mu\mu$m, was determined by observing the optical waveguide modes. See the article by R. V. Schmidt and I. P. Kaminow, *Applied Physics Letters*, Volume 25, page 458 (1974). The depth of the Ni diffusion, $b=100$ $\mu$m, was calculated from the temperature dependence of the Ni diffusion constant. This temperature dependence was determined by curve fitting known diffusion profile transmitter 11 is of the frequency multiplexing type which combines several channels of center frequencies $f_1, f_2, \ldots$ up to $f_n$ for transmission on a common carrier over a transmission medium 12, illustratively a coaxial cable, or via a freely propagating radio wave, to the receiver 13 which must demultiplex the various channels of differing center frequencies.

For one such channel, the channel-dropping filter 16 serves to separate the modulated wave of center frequency $f_1$ from the other frequency components of the multiplexed signal. Transducers 18 through 21 and 29 through 31 illustratively operate in the conventional way for acoustic surface wave transducers. The periodic stripe-like or grating pattern 22 is oriented at 45 degrees with respect to the direction of propagation of the acoustic wave in crystal 16 so that the essentially Bragg-type reflections resulting from the acoustic velocity perturbations yielded by the pattern 22 are directed at right angles to the incident path of the acoustic wave to the output transducers 23 through 27; which is similar to the other transducers. The strength of the incremental reflection from each diffused region is directly related to the thickness $\tau$ of the metal deposited originally on the surface before diffusion.

Optionally, the crystal 16 may include means for confining the acoustic waves to a surface region of the crystal 16 near the transducers; but such a guiding region is not shown since acoustic surface waves (ASW) are illustratively the mode of transmission through crystal 16. It should be clear, nevertheless, that the diffused metal affects the bulk acoustic properties of the crystal.

The extracted modulated wave at center frequency $f_1$ is intercepted by the single channel detector 15, which yields the desired modulation content originally transmitted in that channel as its output signal. The remaining frequency bands at $f_2$ . . . may be transmitted on to other similar receivers.

The transmitter 11, medium 12, detector 15 and other details of receiver 13 that are not shown are all conventional in the communication art.

In order to drop a channel of substantial frequency bandwidth center about $f_1$, the stripes of the pattern 22 would have a selected variability of spacing orthogonal to their elongation to provide the desired bandwidth. The overal amount of reflection at a given frequency may be controlled by varying the initial metal stripe thicknesses across the grating.

As a means to obtain the phase velocity measurements and test the feasibility of using diffused velocity perturbations for acoustic surface wave grating reflectors as compared to prior art devices test devices of the type illustrated in FIG. 2, employing a pattern 22 of substantial periodically spaced stripe-like regions, were fabricated. The transducers had a 145 MHz center frequency and the gratings had a wavelength, A, of 12 $\mu$m and a length, L, of 540 periods. Three separate devices were fabricated. Metallic aluminum strips, 6 $\mu$m wide, on the surface, but not diffused into it, formed one grating and diffused 6 $\mu$m wide Ti strips 1000A and 15000A thick formed the other two gratings. The metal Al was chosen to form periodic velocity perturbations of the prior art type by the piezoelectric $\Delta v/v$ effect. Titanium was chosen to form the diffused velocity perturbations in the other two devices because its diffusion depth is less than the grating wavelength.

From knowledge of the acoustic surface wave transmission loss through the gratings as a function of frequency, the grating velocity perturbation can be obtained from coupled mode descriptions of grating reflectors. Using a plane wave approximation for an acoustic surface wave, it can be shown that the maximum reflectivity, R, and the fractional bandwidth zeros, $\Delta f/f$, for a grating reflector is given by $$R = \tanh^2(kL) \qquad (2)$$

and $$\Delta f/f = \frac{2A}{L}(1+(\kappa L/\pi)^2)^{1/2}, \qquad (3)$$

where k is the grating coupling coefficient. It can further be shown that $$\kappa = \frac{2}{\lambda} \frac{\Delta v}{v} \qquad (4)$$

where $\lambda$ is the acoustic wavelength and $\Delta v/v$ is the fractional periodic velocity change assumed to occur every half grating wavelength. Thus, by measuring $\Delta f/f$ from the transmission loss curves measured by conventional network analyzer techniques the coupling coefficient and $\Delta v/v$ can be calculated from Equation (3). The results of these calculations are given in Table II. The values of $\Delta v/v$ for Ti diffused velocity perturbations are consistent with those given in Table I. Furthermore, the calculated value of the piezoelectric $\Delta v/v$ is in good agreement with the established value of 0.0246. Also in Table II the experimentally observed maximum rejection, 1-R, is tabulated along with the maximum rejection calculated from Equation (2). Reasonable agreement is obtained for the diffused gratings.

TABLE II

| Material | Thickness A | $\Delta f/f$ | $\kappa L$ | $\Delta v/v$ | Cal. Rejection (dB) | Meas. Rejection (dB) |
|---|---|---|---|---|---|---|
| Metallic Al | 1000 | .0150 | 12.66 | .0234 | 116 | 16–50 |
| Diffused Ti | 1000 | .0046 | 2.34 | .0043 | 15.2 | 10.5 |
| Diffused Ti | 1500 | .00586 | 3.85 | .0071 | 27.4 | 27.0 |

It was noticed that the diffused gratings have uniform and symmetric frequency characteristics, while the metallic (A1) prior art type grating does not. The latter characteristic is presumably due to the redistribution of the characteristic modes associated with the conducting metallic strip region. Gratings according to my invention do not have the wave redistribution that is associated with metallic gratings deposited on the surface of crystal 16.

In the embodiment of FIG. 2 it is desired to employ my invention to provide a notch filter. Notch filters are typically needed where it is desired to eliminate a hum or other very narrow band interference which has disturbed the communication channel. Nevertheless, such notch filters are also usable in other environments such as laboratory equipment, control systems and the like. The problem is presented by the fact that the signal to be processed is obtained from a source 41 which has supplied not only the desired signal $f_s$ but also combined therewith the narrow band interference $f_x$.

For tutorial purposes, it is assumed that this combined signal is passed in the forward direction through an isolator 42 to the notch filter 44 in which the desired signal $f_s$ is to be passed to the utilization apparatus 45 by the notch filter 44.

The filter 44 includes a lithium niobate or lithium tantalate crystal on which transducers 47 through 52 and 54 through 58, like those of FIG. 1 are disposed. Between the transducers there is diffused into the bulk of the crystal through its surface a plurality of strips forming a pattern 53, wherein the strips are oriented essentially orthogonal to the direction of acoustic wave transmission so that the incremental reflected portions of the wave are directed back through the input interdigital transducer and into isolater 42. Since the center-to-center spacing of the strips in pattern 53 is selected to correspond to multiples of the half-wavelength of the interference frequency $f_x$, the interference propagates back into circulator 43 of the isolator 42 and out a third port of the circulator 43 to a termination 59 in which the power at frequency $f_x$ is dissipated.

Perhaps the most commercially significant current application of acoustic wave filters is the application to intermediate frequency filtering in television circuitry. Such an embodiment is shown in FIG. 3. In FIG. 3 the filter 96 is identical to filter 44 of FIG. 2; but it is placed in its proper relationship to adjacent parts in the typical environment in a television receiver 94. Thus it follows the antenna 93, the tuner 95, first I.F. amplifier 97 and its automatic gain control 104 and precedes the following intermediate frequency amplifier 101 and the picture detection and display stages 102 and 103. Nonselected intermediate frequency components of the amplified signal from amplifier 97 are mostly picked off by sound detector 99 before reaching filter 96 and, in any event, are not intercepted by picture detection and display apparatuses 102 and 103, as they are blocked by filter 96. The advantage of employing a filter 96 according to my invention in such an otherwise conventional circuit resides partly in its simplicity and partly in the ready tailoring of its filter characteristic to separate sound and picture I.F. components.

The applications of my discovery are not limited to periodic patterns of increased acoustic wave velocity but can also be applied to such nonperiodic structures as acoustic waveguides defined by the diffusion of the metal into lithium niobate or lithium tantalate. For these applications, it may be desirable to diffuse chromium or nickel, which respectively have smaller and larger diffusion constants than Ti, and can most easily be used to define a suitable cross section for waveguiding in the crystalline material. In fact, it is apparent from my analysis that many different diffusant metals can be used in devices of my invention, for differing applications.

For example, in the substantial planar waveguide of FIG. 4, it is desired to have a guiding medium 62 in lithium niobate or lithium tantalate between a signal transmitter 61 and a signal receiver 63. To that end, substantially uniformly diffused regions 64 are created on either side of the desired waveguiding channel 71. For bulk acoustic wave propagation, the depth of this channel 71 may also be restricted in part by another diffusion of metal in the lithium niobate crystal from the surface opposite the transducers below the level of the uniformly diffused regions 64. As shown, the transducers 65 through 70 and 72 through 77 are adapted to propagate and receive acoustic surface waves; and the last mentioned diffusion is unnecessary. It should be clear, however, that it is the bulk properties of the acoustic crystal with respect to the acoustic wave velocity that are affected by the metal diffusion into the region 64.

While an acoustic waveguide is an entirely different device from an optical waveguide, the device can perhaps be untuitively understood by those more familiar with optical waveguides by considering that the increase in acoustic velocity in regions 64 is comparable to a decrease in optical index of refraction in an analogous optical waveguide.

Surprisingly, it is found that over the modest propagation distances tried so far, the increase in acoustic loss in a medium such as guiding medium 62 on account of the diffused region 64 appears to be negligible. It should be noted that, in an optical waveguide some metals such as nickel can cause disastrously high losses, but are found to be readily usable in the acoustic guide of FIG. 4.

The acoustic guide can also assume a cylindrical fiber-like geometry as shown in FIG. 5. The principal modification in the transmitting apparatus 81 and receiving apparatus 83 relates to the form of transducer, typically a radically symmetrical transducer.

Advanced techniques for reducing the tendency to stress and cracking in the use of such transducers are disclosed in the copending patent application of G. D. Boyd and L. A. Coldren Case 13-2, Serial No. 496,645, filed Aug. 12, 1974 and assigned to the assignee hereof.

Figure 6:
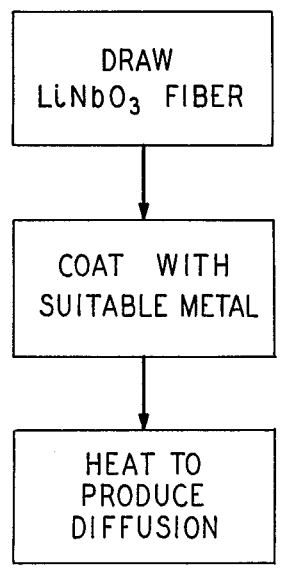
FIG. 6 shows a flow chart of the steps typically employed in producing the embodiment of FIG. 5. .

The production of a fiber acoustic guide 82 in lithium niobate was not trival and was accomplished by a sequence of steps as shown in FIG. 6. First, a lithium niobate fiber was drawn down to a diameter of several acoustic wavelengths by the recently developed single crystal fiber drawing technique in which a hot pointed tungsten wire or a sharply pointed seed crystal of the lithium niobate of desired orientation is touched to the surface of a melt of lithium niobate and then gradually drawn away at a rate which determines the diameter of the drawn fiber.

Next, the resulting single crystal fiber is coated with a suitable metal layer, illustratively nickel, over its entire outer surface to a depth of 0.4 $\mu$m. The plated or coated fiber is then heated to about 1100°C for about 24 hours to produce a diffused depth, $b$, of 50 $\mu$m. Oxygen is then flowed over the cooling fiber to replace the oxygen loss during the heating step.

The lowest acoustic velocity occurs in the center of the resulting fiber so that an acoustic wave propagated down the guide 82 has its diffracting outer portions constantly rebent toward the guide axis.

The guide 82 is basically a so-called graded velocity acoustic guide of the type which was discovered to be desirable in the previously filed copending application of G. D. Boyd et al Case 13-2, Ser. No. 496,645, filed Aug. 12, 1974 and assigned to the assignee hereof. The guide 82 represents the most practical and most easily fabricated form of the guide according to that prior invention proposed to date.

It should be clear that various modifications of the preceding embodiments of my invention are possible within its spirit and scope. For example, grating periods at least as fine as 6 $\mu$ should be possible with diffused titanium. Other metals, such as chromium, which have smaller diffusion constants can be used for shorter periods. It should also be possible to change the magnitude of the velocity perturbation otherwise obtained with the parameters shown in Table I by depositing the metallic film or strips with a selected variation of thickness prior to diffusion. While I prefer the photolithographic technique called the liftoff technique, it should be clear that other photolithographic techniques are also feasible, in that they are also compatible with the deposition of the metal strips that are desired prior to the diffusion step.

Other applications of my invention may include more widely varied spacing grating-type filters such as would be usable for pulse compression of a chirped pulse. In addition, in fabrication of more complex filter characteristics it should be clear that a grating resonator composed of two separate grating reflectors disposed on opposite sides of a single transducer can provide very sharply defined poles and zeros for a composite filter characteristic. Indeed, several such resonators can illustratively be used in a single filter.

In general, the measurement of the acoustic wave velocity variations obtained by my invention may be accomplished by the technique disclosed by L. A. Coldren and myself, *Applied Physics Letters*, Volume 23, No. 10 at pages 482–483 (1973).

On analogy to the devices 4 and 5, a bulk wave resonator instead of a grating reflector resonator may be constructed simply by diffusing a metal into a selected volume of a lithium niobate or a lithium tantalate crystal substantially uniformly with a relatively abrupt transition or discontinuity with respect to the surrounding undiffused crystal. A substantial portion of an acoustic wave that enters this region will be multiply reflected before exiting from the region.

What is claimed is:

1. An electronic device comprising a body of material capable of propagating acoustic waves, said body comprising at least one region of lithium niobate, first transducer means attached to said body to couple acoustic waves into said region, and second transducer means attached to said body for coupling acoustic waves out of said region, characterized by the improvement for selective transmission of acoustic waves in a particular frequency band that said lithium niobate region includes a pattern of portions into which a metal has been diffused to provide increased acoustic wave velocity in those portions.

2. An electronic device comprising a body of material capable of propagating acoustic waves, said body comprising at least one region of lithium tantalate, first transducer means attached to said body to couple acoustic waves into said region, and second transducer means attached to said body for coupling acoustic waves out of said region, characterized by the improvement for selective transmission of acoustic waves in a particular frequency band that said lithium tantalate region includes a pattern of portions into which a metal has been diffused to provide increased acoustic wave velocity in those portions.

3. An electronic device according to claim 1 in which the diffused metal is a transition metal.

4. An electronic device according to claim 2 in which the diffused metal is a transition metal.

5. An electronic device according to claim 1 in which the pattern of portions comprises a substantially periodic pattern of stripe-like portions yielding a grating-like effect for the acoustic waves.

6. An electronic device according to claim 2 in which the pattern of portions comprises a substantial periodic pattern of stripe-like portions yielding a grating-like effect for the acoustic waves.

7. An electronic device according to claim 5 in which the substantially periodic pattern comprises a pattern in which the metal is present in the bulk of the material to a substantial depth.

8. An electronic device according to claim 6 in which the substantially periodic pattern comprises a pattern in which the metal is present in the bulk of the material to a substantial depth.

9. An electronic device according to claim 1 adapted to be an acoustic waveguide in that the metal appears in substantial concentration outside of a limit of a selected guiding channel in the crystal.

10. An electronic device according to claim 2 adapted to be an acoustic waveguide in that the metal appears in substantial concentration outside of a limit of a selected guiding channel in the crystal.

11. A filter for television circuitry comprising a body of material capable of propagating acoustic waves, said body comprising at least one region of lithium niobate, first transducing means attached to said body to couple acoustic waves into said regions, and second transducing means attached to said body for coupling accoustic waves out of said region, characterized by the improvement for selective transmission of acoustic waves in a selected intermediate frequency band that said region includes a pattern of stripe-like portions into which a metal has been diffused to provide increased acoustic wave velocity in those portions, the spacing of said stripe-like portions varying from a period equal to an integral multiple of the intermediate-frequency wavelength by an amount related to the bandwidth of the intermediate-frequency wave to be transmitted through said filter.

12. An intermediate-frequency filter according to claim 11 in which the metal is selected from the group consisting of titanium, nickel and chromium.

13. A filter for communication channel dropping comprising a body of material capable of propagating acoustic waves, said body comprising at least one region of lithium niobate, first transducing means attached to said body to couple acoustic waves into said regions, and second transducing means attached to said body for coupling acoustic waves out of said region, characterized by the improvement for selective transmission of acoustic waves in a selected channel frequency band that said region includes a pattern of stripe-like portions into which a metal has been diffused to provide increased acoustic wave velocity in those portions, the spacing of said stripe-like portions varying from a period equal to an integral multiple of the channel center wavelength by an amount related to the bandwidth of the channel to be transmitted through said filter.

14. An acoustic waveguide comprising a body of material capable of propagating acoustic waves, said material being selected from the group consisting of lithium niobate and lithium tantalate, said body having at least an outer region including a diffused metal that increases the acoustic wave velocity.

15. An acoustic waveguide according to claim 14 in which the metal has a concentration gradient decreasing toward the guide axis.

16. An acoustic waveguide according to claim 14 in which the body includes at least two regions including diffused metal.

* * * * *

UNITED STATES PATENT AND TRADEMARK OFFICE
CERTIFICATE OF CORRECTION

PATENT NO. : 3,946,338
DATED : March 23, 1976
INVENTOR(S) : Ronald V. Schmidt

It is certified that error appears in the above-identified patent and that said Letters Patent are hereby corrected as shown below:

Column 3, line 8, delete second "to"; line 61, delete first "$\mu$". Column 4, line 4, "bi" should be --b--. Column 5, line 9, after "..." insert --$f_n$--; line 41, "A" should be --$\Delta$--; line 59, after "bandwidth" insert --between--; equation 3, "2A" should be --$2\Delta$--. Column 6, line 1, "k" should be --$\kappa$--.

Column 7, line 51, "transudcers" should be --transducers--. Column 8, line 17, "trival" should be --trivial--.

Signed and Sealed this

Twenty-fourth Day of August 1976

[SEAL]

Attest:

RUTH C. MASON
Attesting Officer

C. MARSHALL DANN
Commissioner of Patents and Trademarks